US008760946B2

(12) United States Patent
Dearth et al.

(10) Patent No.: US 8,760,946 B2
(45) Date of Patent: Jun. 24, 2014

(54) METHOD AND APPARATUS FOR MEMORY ACCESS DELAY TRAINING

(75) Inventors: Glenn A Dearth, Groton, MA (US); Warren R Anderson, Westborough, MA (US); Anwar P Kashem, Cambridge, MA (US); Richard W Reeves, Westborough, MA (US); Edoardo Prete, Arlington, MA (US); Gerald R Talbot, Concord, MA (US)

(73) Assignee: Advanced Micro Devices, Sunnyvale, CA (US)

( * ) Notice: Subject to any disclaimer, the term of this patent is extended or adjusted under 35 U.S.C. 154(b) by 43 days.

(21) Appl. No.: 13/477,642

(22) Filed: May 22, 2012

(65) Prior Publication Data

US 2013/0315014 A1    Nov. 28, 2013

(51) Int. Cl.
*G11C 8/18* (2006.01)
*G11C 7/22* (2006.01)
*G11C 7/10* (2006.01)
*G11C 11/4076* (2006.01)

(52) U.S. Cl.
CPC *G11C 7/22* (2013.01); *G11C 7/222* (2013.01); *G11C 7/1066* (2013.01); *G11C 11/4076* (2013.01)
USPC .... 365/193; 365/194; 365/233.1; 365/233.17

(58) Field of Classification Search
CPC ........ G11C 7/22; G11C 7/222; G11C 7/1066; G11C 11/4076; G11C 8/18
USPC ............. 365/193, 194, 233.1, 233.12, 233.17
See application file for complete search history.

(56) References Cited

U.S. PATENT DOCUMENTS

| 7,457,175 | B1 | 11/2008 | Griffith et al. | |
| 7,886,174 | B2 | 2/2011 | Spry et al. | |
| 8,509,005 | B2 * | 8/2013 | Byun | 365/189.05 |
| 2006/0136769 | A1 | 6/2006 | Kizer et al. | |
| 2009/0006776 | A1 | 1/2009 | Spry et al. | |
| 2009/0244997 | A1 | 10/2009 | Searles et al. | |
| 2012/0218841 | A1 | 8/2012 | Hunt | |

FOREIGN PATENT DOCUMENTS

| EP | 1510930 | 3/2005 |
| WO | 2008079910 | 7/2008 |

OTHER PUBLICATIONS

International Search Report and Written Opinion in application No. PCT/US2013/042281 mailed Aug. 5, 2013 pp. 1-10.

* cited by examiner

*Primary Examiner* — Tan T. Nguyen
(74) *Attorney, Agent, or Firm* — Meyertons Hood Kivlin Kowert & Goetzel; Erik A. Heter

(57) ABSTRACT

Various method and apparatus embodiments for training a delay for enabling a data strobe signal in a memory subsystem are disclosed. In one embodiment, a system includes a memory controller configured to receive a data strobe signal. The memory controller includes a training circuit. The training circuit includes a first storage circuit coupled to receive the data strobe signal on a data input and an enable signal on a clock input, and a training unit configured to, based on an output signal received from the first flip-flop, adjust a phase of the enable signal until an assertion of the enable signal coincides with a preamble indication in the data strobe signal.

29 Claims, 5 Drawing Sheets

METHOD AND APPARATUS FOR MEMORY ACCESS DELAY TRAINING

BACKGROUND

1. Technical Field

This disclosure relates to computer systems, and more particularly, to training delay times for signal used to synchronize reads of memory in computer system.

2. Description of the Related Art

In order to properly read data from a memory, determining a time when the data is valid is an important factor. To optimize computer system performance, minimizing this value may be desired. To determine the optimal time at which data received from a memory may be read, a training procedure may be performed.

For various types of double data rate (DDR) memories, such as DDR, DDR2, and DDR3, a data strobe signal may be returned with data from the memory during a read operation. The data strobe signal is a source synchronous clock signal that may be used to synchronize the data at a receiver in a memory controller, as well as indicating that the data is valid. Training of the data strobe signal to ensure correct timing may be performed at the beginning of system operation.

One method to perform training of a DDR data strobe begins with performing of reads at a low operational frequency known as a seed. The training procedure may then conduct a series of reads to determine an optimal time to enable the data strobe signal to observe the returned data at a first frequency known as a seed. The seed may be determined based on characterizations conducted in a lab during a design phase of the computer system. The training may be conducted at different frequencies until the optimal time to enable the data strobe signal is determined. The resulting trained optimal time at the original frequency may be used to calculate an approximate starting time for subsequent training at a next higher frequency. The resulting second trained value may be used to calculated an approximate starting time for training at a third higher frequency, and so on. The method of using trained times at lower frequencies to determine starting times for training at higher frequencies can be repeated multiple times until all frequencies that will be used in normal operation have been trained.

SUMMARY OF EMBODIMENTS OF THE DISCLOSURE

Various method and apparatus embodiments for training a delay for enabling a data strobe signal are disclosed. In one embodiment, a system includes a memory controller configured to receive a data strobe signal. The memory controller includes a training circuit. The training circuit includes a first storage circuit coupled to receive the data strobe signal on a data input and an enable signal on a clock input, and a training unit configured to, based on an output signal received from the first storage circuit, adjust a phase of the enable signal until an assertion of the enable signal coincides with a preamble indication in the data strobe signal.

In one embodiment, a method includes adjusting a phase of an enable signal relative to a data strobe signal received from a memory. The phase may be adjusted until an assertion of the enable signal coincides with a preamble indication in the data strobe signal. Adjusting may be accomplished by adjusting a delay of a delay locked loop (DLL). The method further includes storing an indication of the delay into a register One embodiment of a memory subsystem includes a memory coupled to a memory controller. The memory controller is configured to send a read request to the memory. The memory is configured to, responsive to the read request, provide data and a data strobe signal to the memory controller. The memory controller includes a training unit configured to adjust a phase of an enable signal relative to the data strobe signal until an assertion of the enable signal coincides with a preamble indication in the data strobe signal, wherein said adjusting comprises adjusting a delay of a delay locked loop (DLL). The memory controller is further configured to store an indication of the delay into a register.

BRIEF DESCRIPTION OF THE DRAWINGS

Other aspects of the disclosure will become apparent upon reading the following detailed description and upon reference to the accompanying drawings, which are briefly described as follows.

Figure 1:
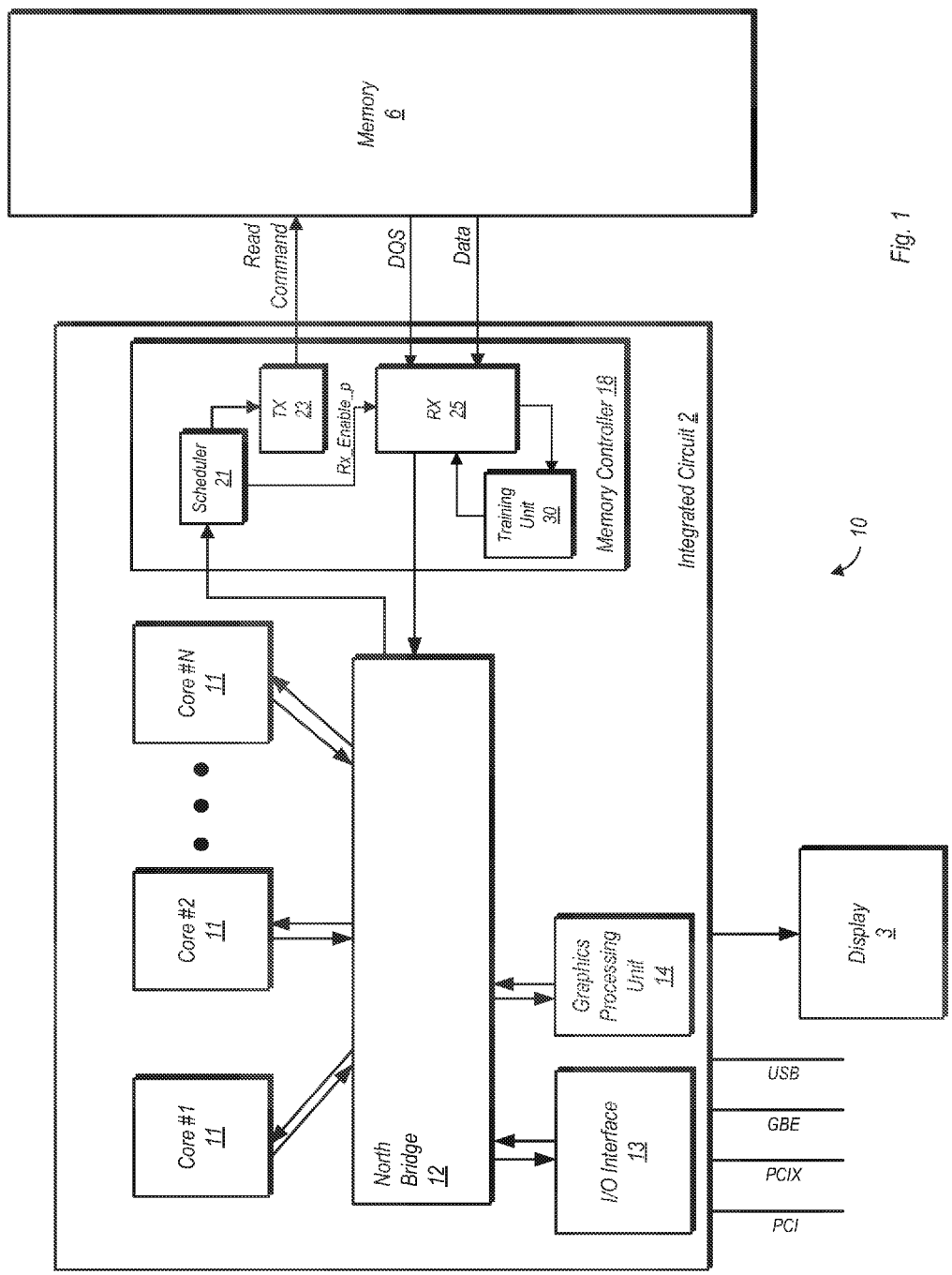
FIG. 1 is a block diagram of a system including a processing unit, display, peripheral buses, a memory and a memory controller.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

FIG. 1 is a block diagram of one embodiment of a computer system 10. In the embodiment shown, computer system 10 includes an integrated circuit (IC) 2 coupled to a memory 6. Computer system 10 may include, for example, a conventional computer system such as a laptop, desktop or server computer, or various other types of computing devices such as, for example, handheld computing devices (e.g., mobile phones or smart phones), digital televisions, tablet computing devices and the like. In the embodiment shown, IC 2 is a system on a chip (SoC) having a number of processor cores 11. Embodiments of IC 2 may include central processing units (CPUs), graphics processing units (GPUs), accelerated processing units (APUs), application processors, digital signal processors (DSPs) and the like. In various embodiments, the number of processor cores may be as few as one, or may be as many as feasible for implementation on an IC die. In multi-core embodiments, processor cores 11 may be identical to each other (i.e. homogenous multi-core), or one or more cores may be different from others (i.e. heterogeneous multi-core). Processor cores 11 may each include one or more execution units, cache memories, schedulers, branch prediction circuits, and so forth. Furthermore, each of processor cores 11 may be configured to assert requests for access to memory 6, which may function as the main memory for computer system 10. Such requests may include read requests and/or write requests, and may be initially received from a respective processor core 11 by north bridge 12. Requests for access to memory 6 may be initiated responsive to the execution of certain instructions, and may also be initiated responsive to prefetch operations.

North bridge 12 in the embodiment shown may provide routing and control of communications between the various functional units of IC 2. Accordingly, north bridge 12 may include one or more crossbar units configured to couple different functional units to one another (e.g., coupling one of the processor cores 11 to memory controller 18 during a memory access request). Furthermore, north bridge 12 may implement various power management functions used to optimize power consumption vs. performance during the operation of IC 2.

I/O interface 13 is also coupled to north bridge 12 in the embodiment shown. I/O interface 13 may function as a south bridge device in computer system 10. A number of different types of peripheral buses may be coupled to I/O interface 13. In this particular example, the bus types include a Peripheral Component Interconnect (PCI) bus, a PCI-Extended (PCI-X), a gigabit Ethernet (GBE) bus, and a Universal Serial Bus (USB). However, these bus types are exemplary, and many other bus types may also be coupled to I/O interface 13. Peripheral devices may be coupled to some or all of the peripheral buses. Such peripheral devices include (but are not limited to) keyboards, mice, printers, scanners, joysticks or other types of game controllers, media recording devices, external storage devices, network interface cards, and so forth. At least some of the peripheral devices that may be coupled to I/O unit 13 via a corresponding peripheral bus may assert memory access requests using direct memory access (DMA). These requests (which may include read and write requests) may be conveyed to north bridge 12 via I/O interface 13.

In the embodiment shown, IC 2 includes a graphics processing unit 14 that is coupled to display 3 of computer system 10. Display 3 may be a flat-panel LCD (liquid crystal display), plasma display, a CRT (cathode ray tube), or any other suitable display type. GPU 14 may perform various video processing functions and provide the processed information to display 3 for output as visual information.

Memory controller 18 in the embodiment shown is coupled to north bridge 12, and in some embodiments, may actually be a component of north bridge 12. Memory controller 18 may receive memory requests conveyed from north bridge 12. Data accessed from memory 6 responsive to a read request (including prefetches) may be conveyed by memory controller 18 to the requesting agent via north bridge 12. Responsive to a write request, memory controller 18 may receive both the request and the data to be written from the requesting agent via north bridge 12. If multiple memory access requests are pending at a given time, memory controller 18 may arbitrate between these requests.

It is noted that memory controller 18 also includes functionality to support writes of data to memory 6, although that functionality is not shown here for the sake of simplicity.

Memory 6 in the embodiment shown may be implemented in one embodiment as a plurality of memory modules. Each of the memory modules may include one or more memory devices (e.g., memory chips) mounted thereon. In another embodiment, memory 6 may include one or more memory devices mounted on a motherboard or other carrier upon which IC 2 may also be mounted. In yet another embodiment, at least a portion of memory 6 may be implemented on the die of IC 2 itself. Embodiments having a combination of the various implementations described above are also possible and contemplated. Memory 6 may be used to implement a random access memory (RAM) for use with IC 2 during operation.

In the embodiment shown, memory 6 is implemented as one of a number of different types of double data rate (DDR) dynamic RAM (DRAM). Such types of DDR DRAM includes the original DDR standard DRAM, DDR2 DRAM, and DDR3 DRAM. It is also contemplated that memory 6 may be implemented as a future standard of DDR DRAM. Irrespective of the particular standard, memory 6 may, responsive to a read request from memory controller 18, return a data strobe signal, DQS, along with the requested data. The data strobe signal is effectively a source synchronous clock signal used to synchronize the data in receiver 25 of memory controller 18. When no data is being returned from memory 6, the data strobe signal may be idle or may be tri-stated. In some cases, the data strobe signal may be tri-stated (i.e., placed in a high impedance state) when reads are not being performed. If the data strobe signal is sampled while tri-stated, it may lead to unpredictable behavior, including erroneous reads and corruption of the internal operation of a delay locked loop (DLL) in receiver 25. However, the method and apparatus embodiments discussed below may avoid sampling the data strobe signal when it is tri-stated.

In the embodiment shown, memory controller 18 includes a scheduler 21 coupled to receive read commands from north bridge 12. Scheduler 21 is configured to schedule the various read commands for transmission to memory 6. In some embodiments, scheduler 21 may be configured to perform arbitration of conflicting read commands. Read commands may be forwarded to transmitter 23 for transmission to memory 6. In addition, scheduler 21 may provide a receive enable signal ('Rx_Enable') to receiver 25 to enable reception of data from memory 6 responsive to the read command.

In the embodiment shown, receiver 25 may include some buffering and timing circuitry to hold the assertion of the enable signal to coincide with the transmission of the data strobe signal from memory 6. This may prevent erroneous data from being received by receiver 25. The timing of the assertion of the enable signal within receiver 25 may be determined by a training procedure performed by training unit 30. Training unit 30 and the corresponding training procedure are discussed in further detail below.

Figure 2:
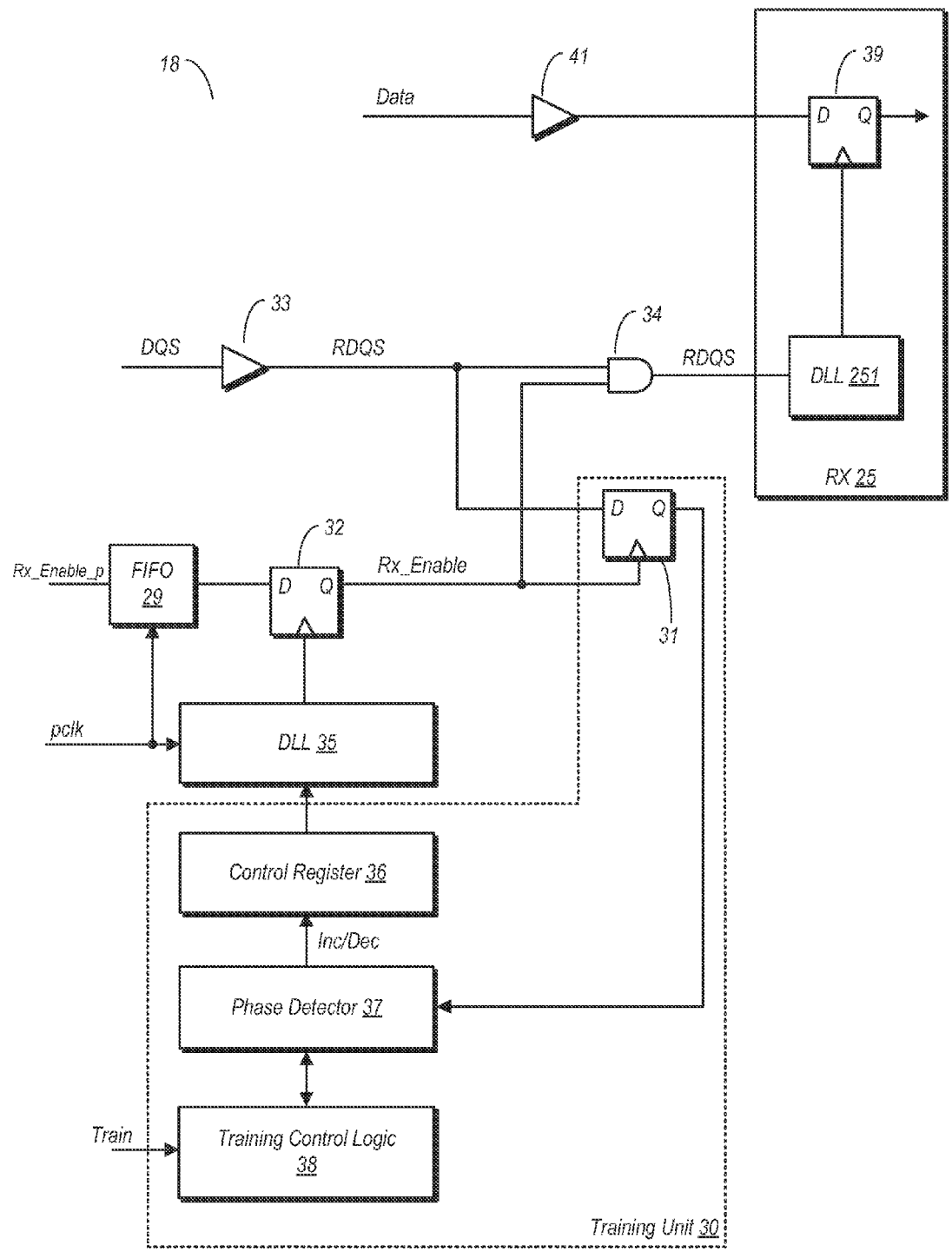
FIG. 2 is a block diagram of one embodiment of a memory controller including a training unit.

Turning now to FIG. 2, a block diagram of one embodiment of memory controller 18. It is noted that not all of the components of memory controller 18 are shown here, and thus other components (including those discussed above) may be included in various embodiments.

In the embodiment shown, memory controller 18 includes a receiver 25 coupled to receive data conveyed from memory 6. The data may be synchronized to a received data strobe signal ('RDQS') based on the data strobe signal conveyed from memory 6 (the received data strobe signal may essentially be the same signal as the data strobe signal provided from memory 6, although they are referred to separately here due to the presence of buffer 33). The received data strobe signal may be gated via logic gate 34 (implemented as an AND gate in this embodiment) using an enable signal ('Rx_enable'). When the enable signal is asserted, the received data strobe is enabled to pass to delay locked loop (DLL) 251 of receiver 25. DLL 251 may in turn provide a corresponding clock signal to flip-flop 39 (or a group of flip-flops) to synchronize the incoming data. Otherwise, when the enable signal is not asserted, the received data strobe is not provided to DLL 251, thereby preventing unintentional data reception in receiver 25. When the enable signal is de-asserted, sampling of a tri-stated data strobe signal is thus avoided, which may prevent the potential for erroneous operation as discussed above. Thus, controlling when the enable signal is asserted and de-asserted may ensure that the data strobe signal is sampled at the proper time to ensure correct operation, i.e., when the data strobe signal is actively toggling between a high state and a low state, such as in the pattern shown in FIG. 3.

The enable signal is based on a received enable signal ('Rx_enable_p') from the same domain as the clock signal provided to DLL 35 ('pclk'). In the embodiment shown, the received enable signal is provided to a first in, first out memory (FIFO) 29. Read and write pointers of FIFO 29 are synchronized to the pclk signal, which may be generated by a phase locked loop (PLL) internal to memory controller 18 and is used to synchronize operations therein. The output of FIFO 29 is coupled to a storage circuit, (flip-flop 32 in this embodiment), which is coupled to receive a clock signal from DLL 35. DLL 35 in the embodiment shown is coupled to receive the pclk signal as an input clock, and is configured to provide a delayed version of the pclk signal to flip-flop 32. Accordingly, the Rx_enable signal provided to logic gate 34 may be synchronized to a delayed version of the pclk signal as output by DLL 35.

During a read, the enable signal may be asserted at a particular point in time. If the enable signal is asserted too early, thereby allowing the received data strobe signal to pass to DLL 251, receiver 25 may erroneously receive data. If the enable signal is asserted too late, data returned from memory 6 may not be received by receiver 25. Thus, training may be conducted to determine the optimal time for assertion of the enable signal. In the embodiment shown, memory controller 18 includes a training unit 30, which comprises a flip-flop 31, a phase detector 37, and training control logic 38.

In the embodiment shown, the RDQS signal is received on a data input of flip-flop 31. The clock input of flip-flop 31 is coupled to receive the enable signal output from flip-flop 32. The output of flip-flop 31 is provided to phase detector 37. Based on the output signal received from flip-flop 31, phase detector 37 may determine the phase of the enable signal, Rx_enable, relative to the received data strobe signal, RDQS. In this embodiment, FIFO 29 may provide a logic high to the D input of flip-flop 32 such that the Rx_enable signal is asserted responsive to the preamble. Accordingly, it is the read producing the preamble that may cause the sampling of the RDQS signal by flip-flop 31.

Training of the enable signal may be conducted under the control of training control logic 38. In order to conduct training, a training signal ('Train') provided to training control logic 38 may be asserted. Training control logic 38 may direct phase detector 37 in performing the training algorithm. Information provided by phase detector 37 may be used by training control logic 38 in determining the various steps to be performed in the training algorithm.

The output of phase detector 37 in the embodiment shown includes one or more signals that cause a value stored in control register 36 to increment or decrement. The output of control register 38 may be an indication provided to DLL 35 that is used to set the delay of the pclk signal in order to generate the clock signal provided to flip-flop 32. Accordingly, phase detector 37 may be used to effectively control the phase relationship between the enable and received data strobe signals. More particularly, phase detector 37 in the embodiment shown may increase the delay provided by DLL 32 by incrementing the value stored in control register 36. Reduction of the delay provided by DLL may be performed by phase detector 37 decrementing the value stored in control register 36. In general, changing the delay provided by DLL 32 may change the phase relationship between the received data strobe signal and the enable signal. During training, phase detector 37 may cause the delay of DLL 32 to change based on the output signal provided by flip-flop 31 during some portions of the algorithm, and based on direct control from training control logic 38 during other portions of the algorithm.

Figure 3:
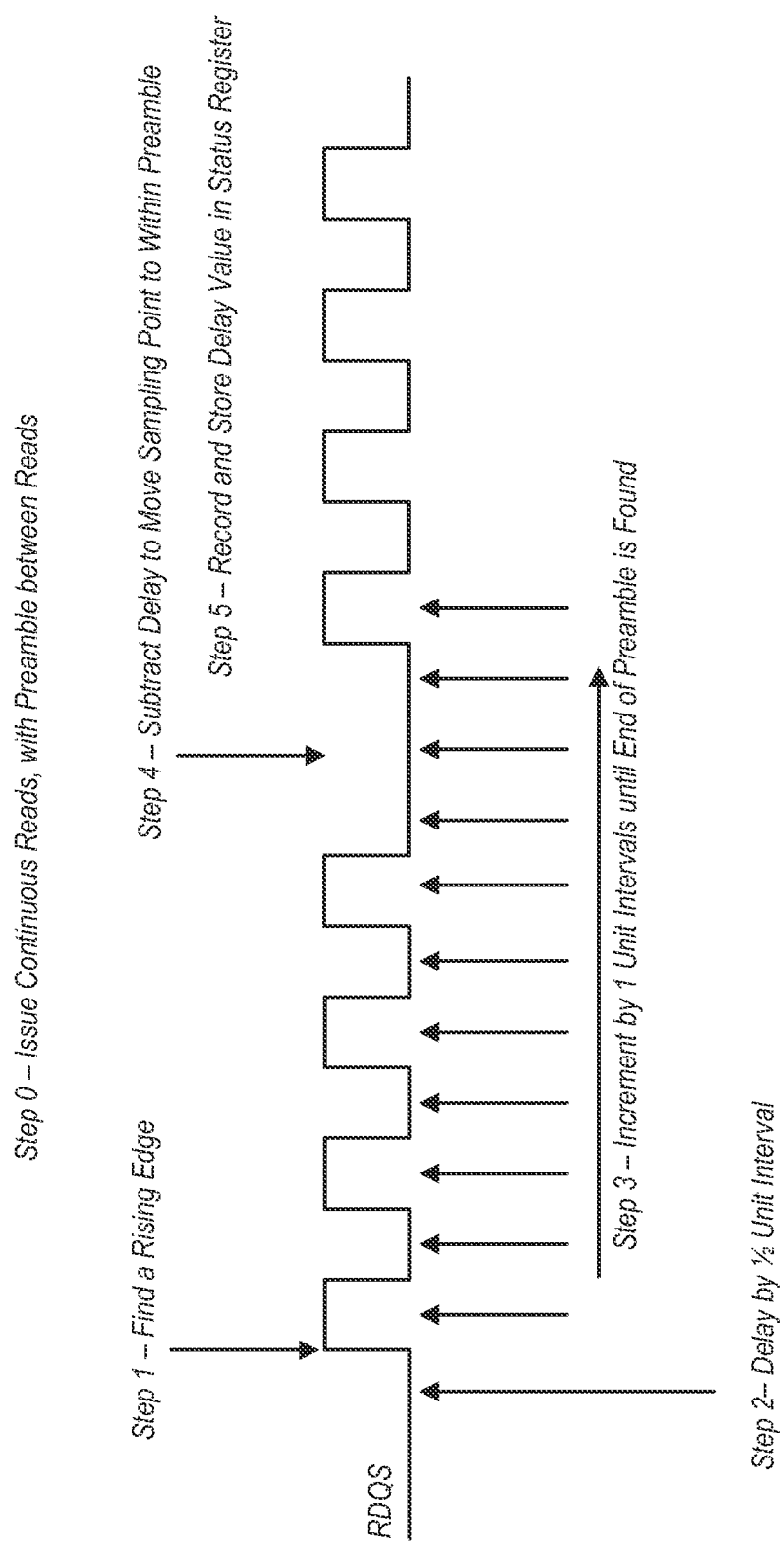
FIG. 3 is a timing diagram illustrating one embodiment of a method for training the delay of an enable signal relative to a data strobe signal.

FIG. 3 is a timing diagram illustrating one embodiment of a training algorithm that may be performed by training unit 30. Training may be initiated by asserting the train signal to training control logic 38. In addition, in Step 0 of the algorithm, continuous reads may be initiated in performing the training procedure, with the reads being punctuated by a preamble. In the illustrated example, the reads are indicated by the cycling of the received data strobe signal between logic 1 and logic 0. The preamble in the illustrated example is indicated by a number of consecutive logic 0's (three in this case) between logic 1's. In general, data read operations may occur in bursts that receive a limited number of data bits, after which the data strobe signal may be tri-stated (i.e. placed in a high impedance state). In order to prepare for each read burst, each read operation may be preceded by a time when the data strobe is driven low. This time is known as a preamble. If read operations occur back to back, the incoming data strobe will show a waveform that looks like a clock and no preamble is generated. More particularly, the bursts may be punctuated by preambles as shown, which may be short enough in duration to prevent the data strobe signal from becoming tri-stated. Otherwise, if the amount of time between reads is greater than the duration of the preamble, the data strobe signal may be tri-stated by the memory.

Step 1 of the algorithm is to locate any rising edge of the received data strobe signal (it is noted that embodiments are possible and contemplated wherein falling edges are located instead). This may be accomplished by cycling the enable signal, measuring the phase difference between the enable signal and the received data strobe signal (which is also cycling), and adjusting the phase difference until it is zero. Once a rising edge has been found, training control logic 38 directs phase detector 37 to subtract one half unit interval of the data strobe signal from the delay of DLL 36. As used herein, the unit interval may be one half the period of the received data strobe signal. Thus, if the data strobe signal has a duty cycle of 50%, the unit interval may be the equivalent of the duty cycle.

After adjusting the phase of the enable signal relative to the received data strobe signal by one half unit interval of the latter, training control logic 38 may direct phase detector 37 to begin adjusting the phase of the enable signal by one unit interval increments until the end of the preamble is found (Step 3). In the illustrated example, the phase adjustment is performed by incrementing. However, decrementing instead of incrementing may also be used to accomplish the same objective. For each increment of phase adjustment, the phase relationship may be reported to training control logic 38, which may retain and monitor a history of the measurements. Based on the history, training control logic 38 may determine when the enable signal is aligned with a first falling edge of a first post-preamble cycle of the received data strobe signal.

Once training control logic 38 has determined that the end of the preamble has been detected, it may instruct phase detector 37 to adjust the phase detector to subtract delay until the phase of the enable signal occurs within the preamble (Step 4). In one embodiment, the enable signal may be aligned to an approximate midpoint of the preamble. Once this adjustment has occurred, phase detector 37 may record an indication of the phase of the enable signal relative to the received data strobe signal in control register 36. At this point the training is complete. For future operations in a mission (i.e. normal) mode, assertion of the enable signal may occur during a preamble prior to a first rising edge of the data strobe signal during one or more consecutive reads of data from memory 6.

By aligning the rising edge of the enable signal with a point within the preamble, more margin may be provided to tolerate drift due to temperature and voltage variations. This in turn may allow the interface to the memory to be operated at faster frequencies. It is further noted that the training algorithm discussed above does not require multiple iterations at different frequencies, nor does it require pre-characterized starting conditions, also known as 'seed values'. This in turn may allow the training procedure to be performed more reliably and in less time than previous methods.

Figure 4:
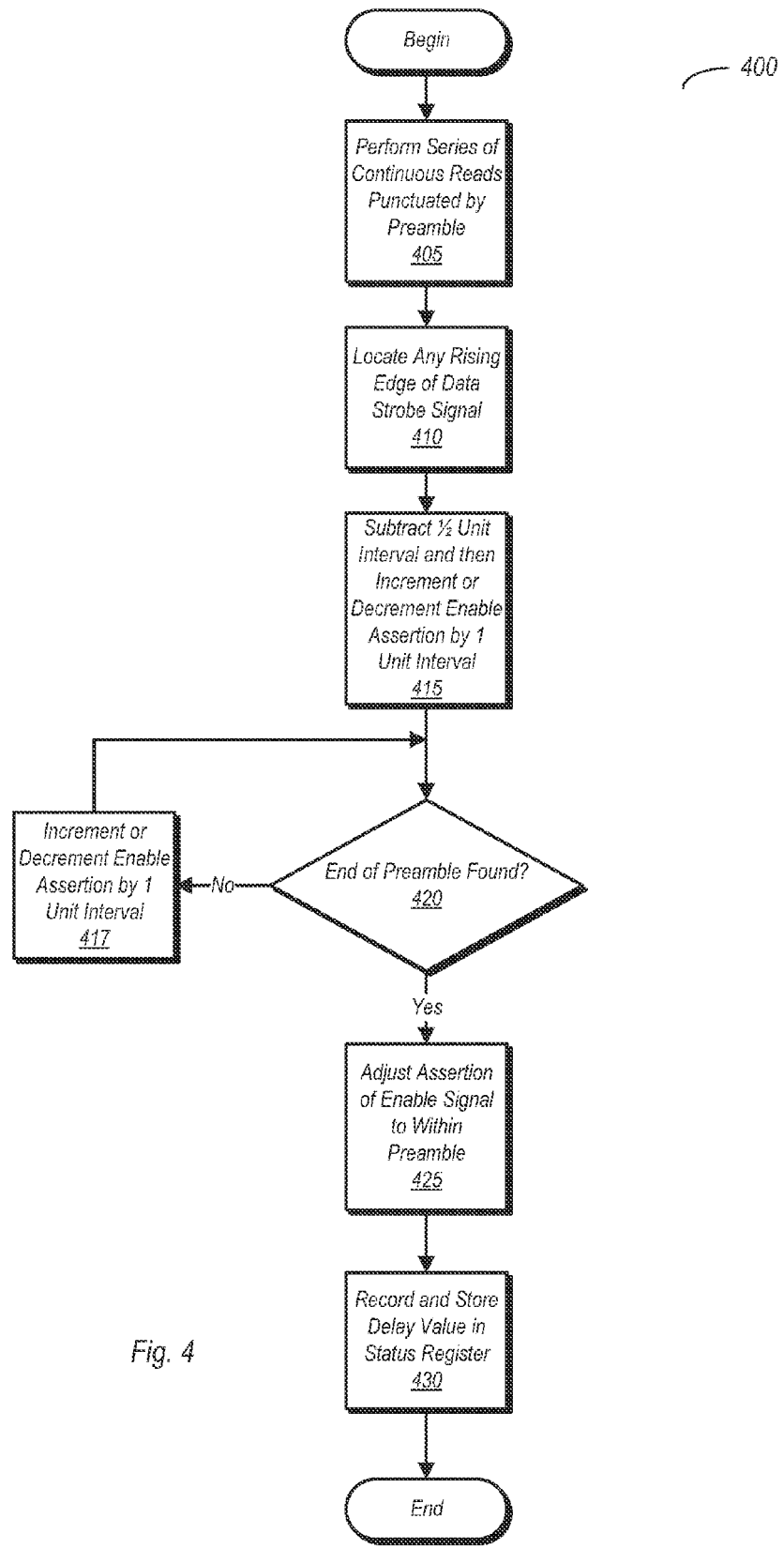
FIG. 4 is a flow diagram illustrating one embodiment of a method for training the delay of an enable signal relative to a data strobe signal.

Turning now to FIG. 4, a flow diagram illustrating one embodiment of a method for training the delay of an enable signal relative to a data strobe signal. While method 400 may be performed using the hardware embodiments described above in reference to FIGS. 1 and 2, it is noted that other hardware embodiments capable of performing this method are also possible and contemplated.

Method 400 begins with the initiation of training by performing multiple series of consecutive memory reads, with the reads being punctuated by a preamble (block 405). The reads may be synchronized to a data strobe signal, which include a preamble (e.g., multiple consecutive logic 0's between alternating cycles of 1's and 0's). Reads may be performed in a series, followed by a preamble, then another series, and so on.

During the training procedure, an edge (a rising edge in this particular case) of the data strobe signal may be located by adjusting the phase of a rising edge of an enable signal until there is zero phase difference with the rising edge of the data strobe (block 410). The rising edge to which the enable signal is aligned to at this point may be any rising edge of the data strobe signal.

Responsive to locating a rising edge of the data strobe signal, a half of one unit interval may be subtracted from the phase of the enable signal and then the phase may be subsequently adjusted in one unit interval increments (block 415). Adjusting may include incrementing or decrementing. If the end of preamble has not been found (block 420, no), then adjustments continue at block 415. Once the end of the preamble has been found (block 420, yes), a final phase adjustment may be made to place the assertion of the enable signal at a point that is within the preamble (block 425). In one embodiment, the final phase adjustment may place the assertion of the enable signal at or near a midpoint of the preamble. After the final phase adjustment is complete, an indication of the corresponding delay value is stored in a control register (block 430). This value may be used to set the delay of a delay locked loop during normal operations.

Figure 5:
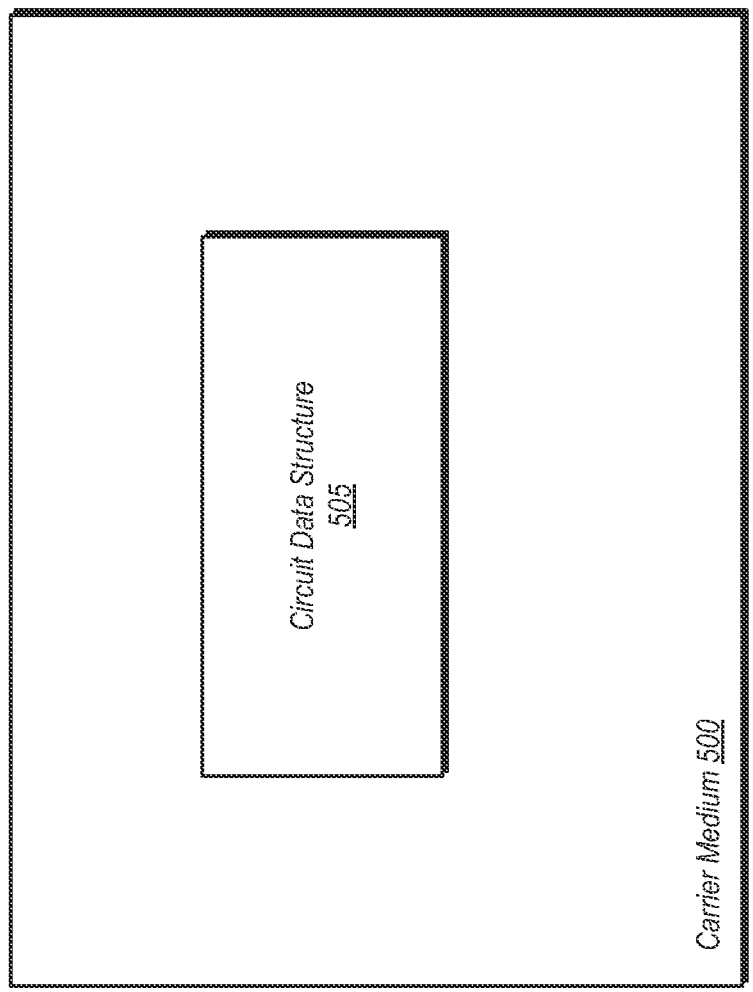
FIG. 5 is a block diagram of one embodiment of a computer readable carrier medium.

Turning next to FIG. 5 a block diagram of a computer accessible storage medium 500 including a database 505 representative of the system 10 is shown. Generally speaking, a computer accessible storage medium 500 may include any non-transitory storage media accessible by a computer during use to provide instructions and/or data to the computer. For example, a computer accessible storage medium 500 may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the data 505 representative of the system 10 and/or portions thereof carried on the computer accessible storage medium 500 may be a database or other data structure which can be read by a program and used, directly or indirectly, to fabricate the hardware comprising the system 10. For example, the database 505 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 10. The netlist may then be placed and routed to produce a data set describing geometric shapes to be applied to masks. The masks may then be used in various semiconductor fabrication steps to produce a semiconductor circuit or circuits corresponding to the system 10. Alternatively, the database 505 on the computer accessible storage medium 500 may be the netlist (with or without the synthesis library) or the data set, as desired, or Graphic Data System (GDS) II data.

While the computer accessible storage medium 500 carries a representation of the system 10, other embodiments may carry a representation of any portion of the system 10, as desired, including IC 2, any set of agents (e.g., processing cores 11, I/O interface 13, north bridge 12, etc.) or portions of agents.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A system comprising:
a memory controller configured to receive a data strobe signal, wherein the memory controller includes a training circuit comprising:
a first storage circuit coupled to receive the data strobe signal on a data input and an enable signal on a clock input; and
a training unit configured to, based on an output signal received from the first storage circuit, adjust a phase of the enable signal until an assertion of the enable signal coincides with a preamble indication in the data strobe signal; and
a logic gate having a first input coupled to receive the data strobe signal and a second input coupled to receive the enable signal, wherein the logic gate is configured to pass the data strobe signal when the enable signal is asserted.

2. The system as recited in claim 1, further comprising a second storage circuit coupled to provide the enable signal to the clock input of the first storage circuit and further coupled to provide the enable signal to the second input of the logic gate, wherein the first and second storage circuits are flip-flops.

3. The system as recited in claim 2, further comprising a delay locked loop (DLL) coupled to receive an input clock signal and configured to generate an output clock signal based on providing a delay to the input clock signal.

4. The system as recited in claim 3, wherein the training unit includes a control register, wherein the DLL is configured to provide an amount of delay to the input clock signal based on a value stored in the control register.

5. The system as recited in claim 4, wherein the training unit is configured to detect the phase of the enable signal relative to the data strobe signal and configured to update the value stored in the control register.

6. The system as recited in claim 1, wherein the preamble comprises a plurality of consecutive logic zeros in the data strobe signal, and wherein the training unit is configured to adjust the phase of the enable signal such that the enable signal is asserted within the preamble.

7. The system as recited in claim 6, wherein the training unit is configured to, responsive to initiation of the training procedure, determine when a rising edge of the data strobe signal is received.

8. The system as recited in claim 7, wherein the training unit is configured to, responsive to determining when a rising edge of the data strobe signal is received:
 incrementally adjust the phase of the enable signal until a rising edge of the enable signal coincides with an end of the preamble;
 update a value stored in a control register for each increment of adjusting; and
 subtract a predetermined amount from the value responsive to determining when the rising edge of the enable signal coincides with the end of the preamble.

9. The system as recited in claim 1, further comprising a memory coupled to convey data and the data strobe signal to the memory controller, wherein the memory controller is configured to synchronize data received from the memory to the data strobe signal.

10. A method comprising:
 adjusting a phase of an enable signal relative to a data strobe signal received from a memory until an assertion of the enable signal coincides with a preamble indication in the data strobe signal, wherein said adjusting comprises adjusting a delay of a delay locked loop (DLL); and
 storing an indication of the delay into register.

11. The method as recited in claim 10, further comprising a training unit detecting the preamble, wherein detecting the preamble comprises detecting a plurality of consecutive logic zeros in the data strobe signal.

12. The method as recited in claim 11, further comprising the training unit adjusting the phase of the enable signal such that it is asserted within the preamble.

13. The method as recited in claim 11, further comprising the training unit detecting a first rising edge of the data strobe signal responsive to initiating a training procedure.

14. The method as recited in claim 13, further comprising the training unit incrementally adjusting the phase of the enable signal until is coincides with an edge of the data strobe signal occurring at an end of the preamble.

15. The method as recited in claim 14, further comprising the training unit adjusting the phase of the enable signal from the end of the preamble to within the preamble subsequent to adjusting the phase of the enable signal to coincide with the end of the preamble.

16. The method as recited in claim 10, further comprising a logic gate passing the data strobe signal to a receiver in a memory controller when the enable signal is asserted and further comprising the logic gate inhibiting passage of the data strobe signal to the receiver when the enable signal is not asserted.

17. The method as recited in claim 10, further comprising:
 a first storage circuit receiving the data strobe signal on a data input and the enable signal on a clock input and generating a corresponding output signal;
 a training unit determining the phase of the enable signal relative to the data strobe signal based on the output signal;
 the training unit causing an adjustment of the delay of the DLL based on the phase of the enable signal relative to the data strobe signal; and
 a second storage circuit receiving a clock signal from the DLL and asserting the enable signal in synchronization with the clock signal received from the DLL.

18. The method as recited in claim 10, further comprising performing a plurality of consecutive reads from memory during said adjusting, wherein the data strobe signal continues to toggle during said adjusting.

19. The method as recited in claim 10, further comprising:
 a memory controller providing a read request to a memory;
 the memory providing the data strobe signal to the memory controller responsive to receiving the read request; and
 asserting the enable signal at a point in time occurring within the preamble.

20. A memory subsystem comprising:
 a memory; and
 a memory controller coupled to the memory, wherein the memory controller is configured to send a read request to the memory, and wherein the memory is configured to, responsive to the read request, provide data and a data strobe signal to the memory controller, wherein the memory controller includes a training unit configured to:
 adjust a phase of an enable signal relative to the data strobe signal until an assertion of the enable signal coincides with a preamble indication in the data strobe signal, wherein said adjusting comprises adjusting a delay of a delay locked loop (DLL); and
 store an indication of the delay into a register.

21. The memory subsystem as recited in claim 20, wherein the training unit includes a first flip-flop coupled to receive the data strobe on an its data input and the enable signal on its clock input.

22. The memory subsystem as recited in claim 21, further comprising a second flip-flop coupled to provide the enable signal to the clock input of the first flip-flop and to a first input of a logic gate, wherein a second input of the logic gate is coupled to receive the data strobe signal.

23. The memory subsystem as recited in claim 22, further comprising a delay locked loop (DLL), wherein the DLL is configured to provide an output clock signal by delaying an input clock signal, wherein the second flip-flop is coupled to receive the output clock signal, wherein the DLL is configured to delay the input clock signal by an amount indicated by a value stored in the register.

24. The memory subsystem as recited in claim 23, further comprising a training unit, wherein the training unit is configured to determine the phase of the enable signal relative to the data strobe signal.

25. The memory subsystem as recited in claim 24, wherein the training unit is configured to incrementally change the value stored in the register to cause a change of phase of the enable signal relative to the data strobe signal until the phase of the enable signal is asserted within the preamble.

26. A non-transitory computer readable medium comprising a data structure which is operated upon by a program executable on a computer system, the program operating on the data structure to perform a portion of a process to fabricate an integrated circuit including circuitry described by the data structure, the circuitry described in the data structure including:
- a memory controller, wherein the memory controller is configured to send a read request to a memory, and wherein the memory is configured to, responsive to the read request, provide data and a data strobe signal to the memory controller, wherein the memory controller includes a training unit configured to:
  - adjust a phase of an enable signal relative to the data strobe signal until an assertion of the enable signal coincides with a preamble indication in the data strobe signal, wherein said adjusting comprises adjusting a delay of a delay locked loop (DLL); and
  - store an indication of the delay into a register 27. The computer readable medium as recited in claim 26, wherein the training unit includes a first flip-flop coupled to receive the data strobe on an its data input and the enable signal on its clock input.

28. The computer readable medium as recited in claim 27, further comprising:
- a second flip-flop coupled to provide the enable signal to the clock input of the first flip-flop;
- a delay locked loop (DLL), wherein the DLL is configured to provide an output clock signal by delaying an input clock signal, wherein the second flip-flop is coupled to receive the output clock signal, wherein the DLL is configured to delay the input clock signal by an amount indicated by a value stored in the register; and
- a training unit, wherein the training unit is configured to determine the phase of the enable signal and further configured to cause an adjustment of the phase of the enable signal.

29. The computer readable medium as recited in claim 26, wherein the data structure comprises one or more of the following types of data:
- HDL (high-level design language) data;
- RTL (register transfer level) data;
- Graphic Data System (GDS) II data.

* * * * *